(12) United States Patent
Lam

(10) Patent No.: US 7,838,971 B2
(45) Date of Patent: Nov. 23, 2010

(54) METHOD TO PROVIDE SUBSTRATE-GROUND COUPLING FOR SEMICONDUCTOR INTEGRATED CIRCUIT DICE CONSTRUCTED FROM SOI AND RELATED MATERIALS IN STACKED-DIE PACKAGES

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 1168 days.

(21) Appl. No.: 11/456,677

(22) Filed: Jul. 11, 2006

(65) Prior Publication Data

US 2008/0044947 A1    Feb. 21, 2008

(51) Int. Cl.
*H01L 23/495* (2006.01)

(52) U.S. Cl. ............ 257/676; 257/686; 257/691; 257/723; 257/735; 257/777; 257/E21.507; 257/E21.508; 438/109; 438/112; 438/455; 438/611; 438/745

(58) Field of Classification Search ............ None
See application file for complete search history.

(56) References Cited

U.S. PATENT DOCUMENTS

| | | | |
|---|---|---|---|
| 6,509,639 B1 * | 1/2003 | Lin | ............ 257/686 |
| 6,599,779 B2 | 7/2003 | Shim, II et al. | |
| 6,744,126 B1 | 6/2004 | Chiang | |
| 6,759,307 B1 | 7/2004 | Yang | |
| 6,857,470 B2 * | 2/2005 | Park et al. | ............ 165/185 |
| 7,005,730 B2 * | 2/2006 | Verma et al. | ............ 257/676 |
| 7,129,113 B1 * | 10/2006 | Lin et al. | ............ 438/109 |
| 2001/0002321 A1 | 5/2001 | Castro | |
| 2005/0002167 A1 | 1/2005 | Hsuan et al. | |
| 2005/0046041 A1 | 3/2005 | Tsai | |
| 2005/0133916 A1 | 6/2005 | Karnezos | |
| 2006/0006553 A1 | 1/2006 | Fuller et al. | |
| 2006/0055009 A1 | 3/2006 | Shim, II et al. | |
| 2006/0118927 A1 | 6/2006 | Verma et al. | |

FOREIGN PATENT DOCUMENTS

WO    WO-2008008586 A3    1/2008

OTHER PUBLICATIONS

PCT Application No. PCT/US07/70994, International Search Report mailed Jan. 31, 2008, 2 pgs.
PCT Application No. PCT/US07/70994, Written Opinion mailed Jan. 31, 2008, 5 pgs.

* cited by examiner

*Primary Examiner*—Mary Wilczewski
*Assistant Examiner*—Khanh B Duong
(74) *Attorney, Agent, or Firm*—Schwegman, Lundberg & Woessner, P.A.

(57) ABSTRACT

An apparatus and a method for packaging semiconductor devices. Disclosed are multi-die packaging apparatuses and techniques, especially useful for integrated circuit dice involving insulative substrates, such as silicon-on-insulator (SOI), where grounding of a base layer is not reasonably practical. Disclosed is a means for effectively grounding all layers of an integrated circuit device regardless of whether the device makes direct contact with a die-attach paddle.

11 Claims, 1 Drawing Sheet

METHOD TO PROVIDE SUBSTRATE-GROUND COUPLING FOR SEMICONDUCTOR INTEGRATED CIRCUIT DICE CONSTRUCTED FROM SOI AND RELATED MATERIALS IN STACKED-DIE PACKAGES

TECHNICAL FIELD

The invention relates to a three-dimensional stackable semiconductor package, and more particularly, to a three-dimensional stackable semiconductor package for package types designed to mount, integrated circuits that are insulated from the bulk of the base substrate material.

BACKGROUND ART

As semiconductor integrated circuit chips become more multi-functional and highly integrated, the chips include more bonding pads (or terminal pads), and thus packages for the chips have more external terminals (or leads). When a conventional package having leads along the perimeter of the package must, accommodate a large number of electrical connection points, the footprint of the package increases. However, a goal in many electronic systems is to minimize an overall size of the systems. Thus, to accommodate a large number of pins without increasing the footprint of the package, either pin pitch (or lead pitch) of the package must decrease and/or integrated circuit dice need to be stacked within a single package (a stacked package). However, a pin pitch of less than about 0.4 mm gives rise to many technical concerns. For example, trimming of a package having a pin pitch less than 0.4 mm requires expensive trimming tools, and the leads are prone to bending during handling of the package. In addition, surface-mounting of such packages demands a costly and complicated surface-mounting process due to a required critical alignment step.

The stacked package, however, may be used to increase a surface, density within the same footprint of the package. Such stacked configurations are known in the art.

In a standard integrated circuit (e.g., a circuit formed on bulk silicon), an IC designer will include one or more bond pads on the top layer design, of the IC. The bond pad is electrically connected to the substrate by wire-bonding the IC to a ground potential. In order for this scheme to function properly, there must be a ground bond pad an the IC.

However, many advanced semiconductor integrated circuit devices are constructed, on substrates where the integrated circuit device is fabricated on a top layer that is electrically insulated from a lower portion (base) of the substrate. These substrate types include separation by implantation of oxygen (SIMOX) and silicon-on-insulator (SOI). In these cases, there is no electrical connection from the integrated circuit circuitry on an uppermost portion of the insulated substrate to the lower portion of the substrate. Thus, in SOI technology, the integrated, circuit (along with any bond pad) is fabricated into a top layer of the SOI material. The insulator layer prevents designing, a substrate-ground bond pad into the IC design for an SOI device. Thus, grounding a ground bond pad with a wire bond will not electrically ground the insulated base portion.

FIG. 1 is an elevation view of a prior art stacked die package 100. The stacked die package 100 includes a die-attach paddle 101, a plurality of package pads 103, a silicon, integrated circuit die 105, and an SOI integrated circuit die 107. The silicon integrated circuit die 105 is adhered to the die-attach paddle 101 by conductive epoxy 109. The SOI integrated circuit die 107, in turn, is adhered to the silicon integrated circuit die 105 by a non-conductive epoxy 111. (Note that there is no reason to use conductive epoxy for adhering the SOI die 107 since no electrical contact can be made with the fabricated circuitry on the top layer of the SOI die 107.) A plurality of wire bond pads 119 are formed on both the silicon die 105 and the SOI die 107. A plurality of SOT wire bonds 113 and a plurality of silicon wire bonds 115 electrically connect the SOI die 107 and silicon die 105 respectively to the plurality of package pads 103. After all electrical connections are formed, an encapsulant layer 121 protects the integrated circuit dice 105, 107 and the plurality of wire bonds 113, 115.

The presence of an insulator layer 123 on the SOI die 107 electrically isolates an SOI base 125 from the circuitry formed on the top layer. Additionally, the SOI die 107 is mounted over a passivation layer (not shown) of the silicon die 105 thereby further preventing grounding of the SOI base.

Therefore, what is needed is a simple and economical means of electrically grounding the base in integrated circuit production materials which contain an insulative layer.

SUMMARY

Disclosed are multi-die packaging apparatuses and techniques, especially useful for integrated circuit dice involving insulative substrates, such as silicon-on-insulator (SOI), where grounding of a base layer is not reasonably practical under the prior art. Disclosed is a means for effectively grounding all layers of an integrated circuit device regardless of whether the device makes direct contact with a die-attach paddle. For example, electrically conductive adhesives may be used along with wire bonding techniques to connect an otherwise insulated base of the SOI device to a ground plane. Alternatively, if an uppermost device in a stack is larger than a lower mounted device, a metal inter-plate feature may be used to connect the SOI base to ground. The described apparatuses and techniques works with any size of die or with dice of various sizes in the same package regardless of stacking configuration.

In one exemplary embodiment, the present invention is a method of packaging a plurality of semiconductor devices in a semiconductor package including mounting a first semiconductor device to a die-attach paddle of the semiconductor package with a first electrically-conductive adhesive layer and mounting a second semiconductor device to an uppermost face of the first semiconductor device with a second electrically-conductive adhesive layer. A trace of the second electrically-conductive adhesive layer is provided to electrically couple the portion of the second electrically-conductive adhesive layer from between the first and second semiconductor devices to a ground pad on the uppermost face of the first semiconductor device.

In another exemplary embodiment, the present invention is a method of packaging a plurality of semiconductor devices in a semiconductor package including mounting a first semiconductor device to a die-attach paddle of the semiconductor package with a first electrically-conductive adhesive layer and mounting a conductive inter-layer spacer to an uppermost face of the first semiconductor package with a second electrically-conductive layer. A second semiconductor device is mounted to an uppermost face of the conductive inter-layer spacer with a third electrically-conductive adhesive layer and a trace of the second electrically-conductive adhesive is provided to electrically couple the portion of the second electrically-conductive adhesive from between the first semiconductor device and the conductive inter-layer spacer to a ground pad on the uppermost face of the first semiconductor device.

In another exemplary embodiment of the present invention, a semiconductor package includes a die-attach paddle, a plurality of package pads located on at least two sides of the die-attach paddle and electrically isolated therefrom, and a first semiconductor device mounted to the die-attach paddle. A: ground pad is situated on an uppermost portion of the first semiconductor device and is configured to electrically couple portions of the first semiconductor device to a ground potential. A second semiconductor device, fabricated from a silicon-on-insulator (SOI) material having a base portion electrically-insulated from a semiconducting portion, has the base portion being in electrical communication with an uppermost face of the first semiconductor device through an electrically-conductive adhesive layer. The electrically-conductive-adhesive layer further being electrically coupled to the ground bond pad on the first semiconductor device.

In another exemplary embodiment of the present invention, a semiconductor package includes a die-attach paddle and a plurality of package pads located on at least two sides of the die-attach paddle and electrically isolated therefrom, and a first semiconductor device mounted to the die-attach paddle. A ground pad is situated on an uppermost portion of the first semiconductor device and is configured to electrically couple portions of the first semiconductor device to a ground potential. An inter-layer spacer having a first and, second face is electrically coupled to the uppermost portion of the first semiconductor device through the first face by an electrically-conductive adhesive layer. The electrically-conductive adhesive layer is electrically coupled to the ground bond pad on the first semiconductor device. A second semiconductor device, fabricated from a silicon-on-insulator (SOI) material having a base portion electrically-insulated from a semiconducting portion, has the base portion being in electrical communication with the second face of the inter-layer spacer through an electrically-conductive adhesive layer.

DETAILED DESCRIPTION

The present invention applies mainly to stacked integrated circuits that are formed on insulative substrate materials, such as silicon-on-insulator (SOI). In an SOI die, an integrated circuit fabricated on an uppermost layer of the SOI substrate does not have any electrical contact with the lowermost portion of the substrate (the substrate; base material). Thus, the integrated circuit cannot be electrically connected to the base material and integrated circuit grounding cannot he: readily accomplished. The SOI substrate base material itself can only be readily grounded if it is in direct contact with the die-attach paddle. However, the integrated circuit fabricated on top remains floating, In a stacked-die package, a bottom (base) die is often attached to the die-attach paddle by, for example, conductive epoxies. The die-attach paddle is also connected to ground. Any upper SOI die stacked on top of the base die would end up mounted to a passivation layer of the base die. The passivation layer is insulative in nature. Therefore, the upper SOI die is additionally prevented from being grounded.

Methods and apparatus are disclosed herein to provide a substrate-ground connection for any SOI die not mounted in direct proximity to the die-attach paddle of a package. The present invention also applies to stacked, semiconductor (bulk material) die packages when optimal semiconductor die substrate grounding is desired. While SOI dice are discussed in the following embodiments, other embodiments may employ other die types with different types of insulative substrate's.

Figure 1:
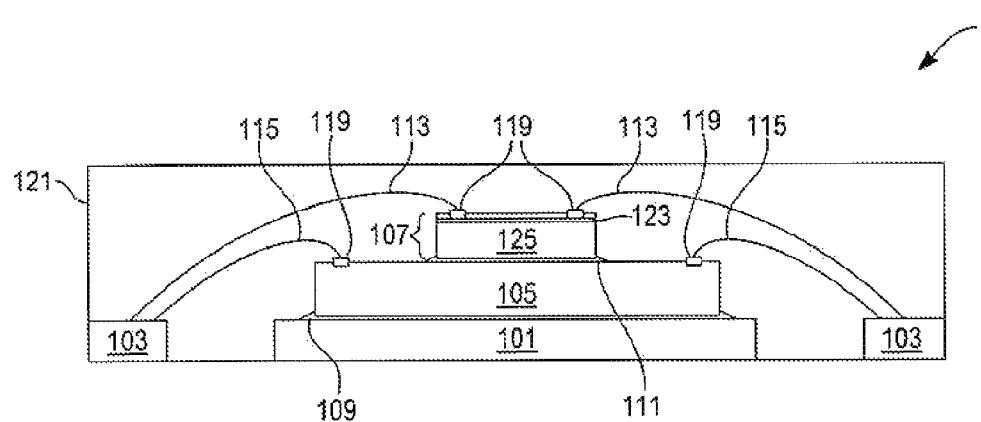
FIG. 1 is an elevation view of a stacked integrated circuit chip carrier package of the prior art.
Figure 2:
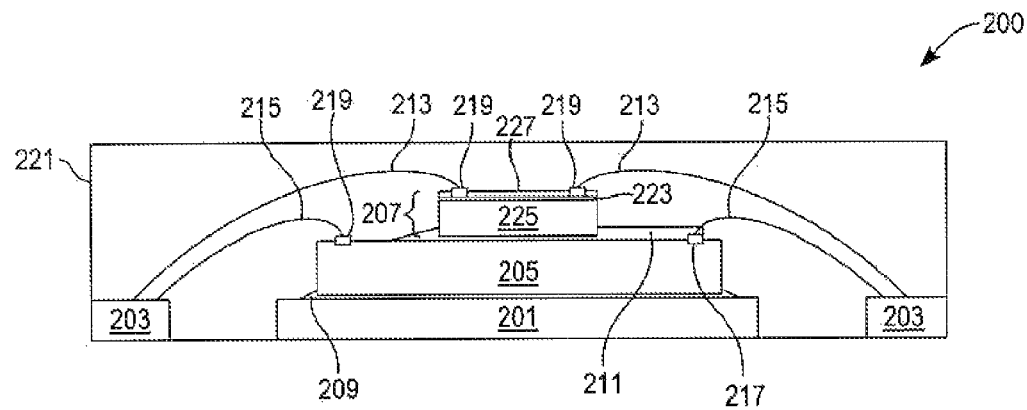
FIG. 2 is an elevation view of a stacked integrated circuit chip carrier package in accordance with an embodiment of the present invention.

With reference to FIG. 2, an exemplary embodiment of a stacked die package 200 of the present invention includes a die-attach, paddle 201, a plurality of package pads 203, a silicon integrated circuit die 205, and an SOI integrated circuit die 207. Alternatively, the silicon integrated circuit die 205 could be a second SOI integrated circuit die as discussed with reference to FIG. 3, infra. In this exemplary embodiment, a face of the silicon integrated circuit die 205 has a larger geometrical area than the SOI integrated circuit die 207.

The SOI integrated circuit die 207 is comprised of three main layers: a base layer 225, an insulator layer 223, and an integrated circuit fabrication layer 227. In a typical SOI wafer, the base layer 225 is silicon, typically about 670 µm in thickness (although this thickness will vary depending upon wafer diameter). The insulator layer 223 is frequently a silicon dioxide layer about 500 nm in thickness and the integrated circuit fabrication layer 227 is frequently a silicon layer about 2 µm in thickness. Circuitry fabricated into the integrated circuit fabrication layer 227 is electrically isolated from the base layer 225 by the insulator layer 223. A plurality of wire bond pads 219 fabricated into the integrated circuit fabrication layer 227 of the SOI integrated circuit die 207 are insulated from the base layer 225 by the insulator layer 223. Another plurality of wire bonds are also fabricated into the silicon integrated circuit die 205.

The silicon integrated circuit die 205 is adhered to the die-attach paddle 201 by conductive epoxy 209. The SOI integrated circuit die 207, in turn, is also adhered to the silicon integrated circuit die 205 by an electrically-conductive epoxy 211. The electrically-conductive epoxy 211 may be, for example, a silver-filled, nickel-filled, or gold-filled. After application of the conductive epoxy 311, the epoxy 211 is allowed to cure. Alternatively, the electrically-conductive epoxy may be in the form of an electrically-conductive tape or other adhesive.

In the stacked die package 200 configuration, the SOI Integrated circuit die 207 frequently is mounted atop a passivation layer (not shown) formed over an uppermost portion of the silicon integrated circuit die 205. In some applications, electrical connection of the base layer 225 of the SOI die 207 to ground potential may be necessary. When the conductive epoxy 211 is dispensed, the dispense pattern is arranged to add a trace of conductive epoxy 211 that electrically connects the base layer 225 of the SOI die 207 to a wire bond ground pad 217 on the silicon die 205. The wire bond ground pad 217 is used to electrically connect the silicon integrated circuit die 205 to ground potential. The plurality of wire bond pads 219 are formed on both the silicon die 205 and the SOI die 207. A plurality of SOI wire bonds 213 and a plurality of silicon wire bonds 215 electrically connect the integrated circuit fabrication layer 227 of the SOI die 207 and silicon die 205 respectively to the plurality of package, pads 203. After all electrical connections are formed, an encapsulant 221 protects the integrated circuit dice 205, 207 and the plurality of wire bonds 213, 215.

Figure 3:
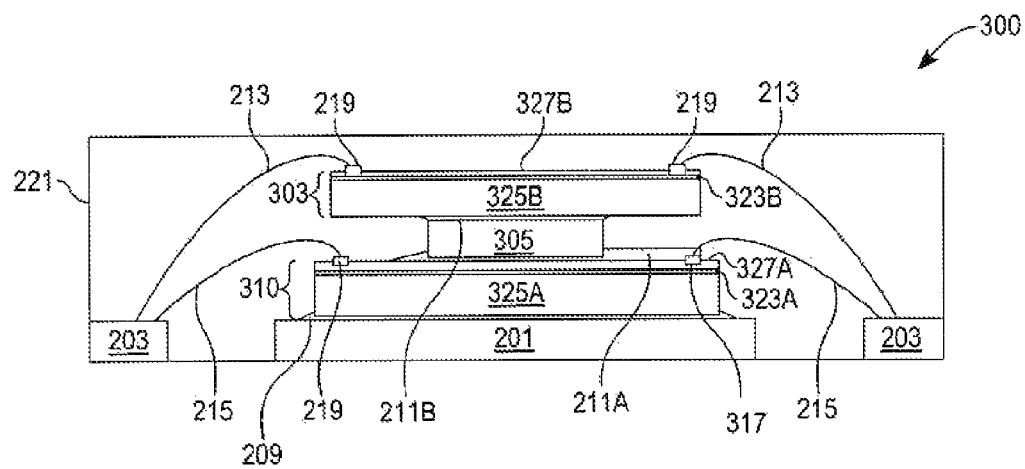
FIG. 3 is an elevation view of a stacked integrated circuit chip carrier package involving dice of similar size in accordance with another embodiment of the present invention.

In FIG. 3, an exemplary embodiment of a stacked integrated circuit chip carrier package 300 involving dice of similar size (i.e., similar areas) includes a die-attach paddle 201, a plurality of package pads 203, a first SOI integrated circuit die 301, a second SOI integrated circuit die 303, and a metal inter-layer spacer 305. The configuration of FIG. 3 is especially useful when, the first and second SOI integrated circuit dice 301, 303 are of approximately similar dimensions. In an alternative embodiment, the metal inter-layer spacer 305 may be fabricated using a core fabricated from an insulating or semiconducting material, rather than metal. The insulating or semiconducting core material is then, coated with an electrically conductive material prior to mounting.

As with the SOI integrated circuit die 207 of FIG. 2, each of the SOI integrated circuit dice 301, 303 is comprised, of three main layers: a base layer 325A, 325B, an insulator layer 323A, 323B, and an integrated circuit fabrication layer 327A, 327B. In a typical SOI wafer, the base layers 325A, 325B are silicon, typically about 670 μm in thickness (although this thickness will vary depending upon wafer diameter), the insulator layer's 323A, 323B are frequently a silicon dioxide layer about 500 nm in thickness, and the integrated circuit fabrication layers 327A, 327B are frequently a silicon layer about 2 μm in thickness. Circuitry fabricated into the integrated, circuit fabrication layers 327A, 327B is electrically isolated from the base layers 325A, 325B by the respective insulator layers 323A, 323B.

A plurality of wire bond pads 219 are fabricated into the integrated circuit fabrication layers 327A, 327B and are thus also, insulated from the base: layers 325A, 325B by the respective insulator layers 323A, 323B.

The first SOI integrated circuit die 301 is adhered to the die-attach paddle 201 by conductive epoxy 209. The metal inter-layer spacer 305 is then adhered to the first SOI integrated circuit die 301 with an electrically-conductive epoxy or a non-conductive epoxy 211A, depending upon a particular application. For providing ground potential to the second SOT integrated circuit die 303 however, an electrically-conductive epoxy is used. The second SOI integrated circuit die 303, in turn, is also adhered to an uppermost face of the metal inter-layer spacer 305 by a conductive or non-conductive epoxy 211B. The electrically-conductive epoxy may be, for example, a silver-filled, nickel-filled, or gold-filled. After application of the epoxy 209, 211A, 211B, the, epoxy is allowed to cure. Mote that all three epoxy layers 209, 211A, 211B, may be the same material.

In the stacked die package 300 configuration, the second SOI integrated circuit die 303 frequently is mounted atop a passivation layer (not shown) formed over an uppermost, portion of the first SOI integrated circuit die 301. In some applications, electrical connection of the base layer 325B of the second SOI die 207 to ground potential may be necessary. When the conductive epoxy 211A is dispensed, the dispense pattern is arranged to add a trace of electrically-conductive epoxy 211A that electrically connects the base layer 325B of the second SOI die 303 to a wire bond ground, pad 317 on the first SOI die 301 through the metal inter-layer spacer 305. The wire bond ground pad 317 is used to electrically connect the first SOI integrated circuit die 301 to ground potential.

The plurality of wire bond pads 219 are formed, on both the first and second SOI dice 301, 303. A plurality of second SOI wire bonds 213 and a plurality of first SOI wire bonds 215 electrically connect the integrated circuit fabrication layer 327B of the second SOI die 303 and the integrated circuit fabrication layer 327A of the first SOI die 301 respectively to the plurality of package pads 203. After all electrical connections are formed, an encapsulant 221 protects the integrated circuit dice 301, 303 and the plurality of wire bonds 213, 215.

In the foregoing specification, the present invention has been described with reference, to specific embodiments thereof. It will, however, foe evident to a skilled artisan that various modifications and changes can be made thereto without departing from the broader spirit and scope of the invention as set forth in the appended claims. For example, skilled artisans will appreciate, that embodiments of the present invention may be readily applied to stacked integrated circuit dice mounted in various types of packages such as TAPP® (thin-array plastic package), ULGA® (ultra-thin land grid array), BCC® (bumped chip carrier), or other similar package types. Also, more than two dice may be readily mounted using the described techniques, by, for example, mounting one or more dice upside-down in relation to an underlying die. Various other types of integrated circuit substrate types other than SIMOX and SOI can benefit from techniques described herein. Other substrate types include, for example, polyethyleneterephthalate (PET) substrates, photomask, or various bonded, wafer types. Additionally, substrates involving bulk materials such as silicon (or other group IV materials) and compound semiconductors (e.g., compounds of elements, especially elements from periodic table groups III-V and II-VI) may be readily mounted and benefit from using the described techniques. The specification and drawings are, accordingly, to be regarded in an illustrative rather than a restrictive sense.

What is claimed is:

1. A semiconductor package comprising:
   a die-attach paddle;
   a plurality of package pads located on at least two sides of the die-attach paddle and electrically isolated therefrom;
   a first semiconductor device in electrical communication with the die-attach paddle;
   a ground pad situated on an uppermost portion of the first semiconductor device and configured to electrically couple portions of the first semiconductor device to a ground potential; and
   a second semiconductor device having at least a portion in electrical communication with an uppermost face of the first semiconductor device through an electrically-conductive adhesive layer, the electrically-conductive adhesive layer further being electrically coupled to the ground bond pad on the first semiconductor device.

2. The semiconductor package of claim 1, further comprising:
   a plurality of bond wires, at least one of the plurality of bond wires electrically coupling the ground pad to one of the plurality of package pads that is configured to be coupled to a ground potential; and
   an encapsulant covering the first and second semiconductor devices and the plurality of bond wires.

3. The semiconductor package of claim 1 wherein a face of the first semiconductor device and a face of the second semiconductor device have dissimilar geometrical areas.

4. The semiconductor package of claim 1 wherein the second semiconductor device is fabricated from a silicon-on-insulator (SOI) material having a base portion electrically-insulated from a semiconducting portion, the base portion being in electrical communication with the uppermost face of the first semiconductor device through the electrically-conductive adhesive layer.

5. A semiconductor package comprising:
   a die-attach paddle;
   a plurality of package pads located on at least two sides of the die-attach paddle and electrically isolated therefrom;

a first semiconductor device mounted in electrical communication with the die-attach paddle;

a ground pad situated on an uppermost portion of the first semiconductor device and configured to electrically couple portions of the first semiconductor device to a ground potential;

an inter-layer spacer having a first face and a second face, the first face of the inter-layer spacer being electrically coupled to the uppermost portion of the first semiconductor device through a first electrically-conductive adhesive layer, the first electrically-conductive adhesive layer further being electrically coupled to the ground bond pad on the first semiconductor device; and a second semiconductor device having at least a portion in electrical communication with the second face of the inter-layer spacer through a second electrically-conductive adhesive layer.

6. The semiconductor package of claim 5, further comprising:

a plurality of bond wires, at least one of the plurality of bond wires electrically coupling the ground pad to one of the plurality of package pads that is configured to be coupled to a ground potential; and an encapsulant covering the first and second semiconductor devices and the plurality of bond wires.

7. The semiconductor package of claim 5 wherein a face of the first semiconductor device and a face of the second semiconductor device have similar geometrical areas.

8. The semiconductor package of claim 5 wherein the inter-layer spacer is fabricated from a metallic material.

9. The semiconductor package of claim 5 wherein the inter-layer spacer is fabricated from an insulating core material surrounded by a metallic material.

10. The semiconductor package of claim 5 wherein the inter-layer spacer is fabricated from a semiconducting core material surrounded by a metallic material.

11. The semiconductor package of claim 5 wherein the second semiconductor device is fabricated from a silicon-on-insulator (SOI) material having a base portion electrically-insulated from a semiconducting portion, the base portion being in electrical communication with the second face of the inter-layer spacer through the second electrically-conductive adhesive layer.

* * * * *

UNITED STATES PATENT AND TRADEMARK OFFICE
CERTIFICATE OF CORRECTION

PATENT NO.         : 7,838,971 B2
APPLICATION NO.    : 11/456677
DATED              : November 23, 2010
INVENTOR(S)        : Ken M. Lam Page 1 of 2

It is certified that error appears in the above-identified patent and that said Letters Patent is hereby corrected as shown below:

In column 1, line 13, delete "mount," and insert -- mount --, therefor.

In column 1, line 23, delete "must," and insert -- must --, therefor.

In column 1, line 39, delete "surface," and insert -- surface --, therefor.

In column 1, line 43, delete "design," and insert -- design --, therefor.

In column 1, line 46, delete "an" and insert -- on --, therefor.

In column 1, line 48, delete "constructed," and insert -- constructed --, therefor.

In column 1, line 56, delete "integrated," and insert -- integrated --, therefor.

In column 1, line 58, delete "designing," and insert -- designing --, therefor.

In column 1, line 64, delete "silicon," and insert -- silicon --, therefor.

In column 2, line 7, delete "SOT" and insert -- SOI --, therefor.

In column 3, line 9, delete "A:" and insert -- A --, therefor.

In column 3, line 27, delete "and," and insert -- and --, therefor.

In column 3, line 57, delete "substrate;" and insert -- substrate --, therefor.

In column 3, line 58, delete "he:" and insert -- be --, therefor.

In column 3, line 62, delete "floating," and insert -- floating. --, therefor.

In column 4, line 6, delete "stacked," and insert -- stacked --, therefor.

In column 4, lines 10-11, delete "substrate's." and insert -- substrates. --, therefor.

In column 4, line 14, delete "die-attach," and insert -- die-attach --, therefor.

In column 4, line 44, delete "311," and insert -- 211, --, therefor.

In column 4, line 64, delete "package," and insert -- package --, therefor.

In column 5, line 7, delete "when," and insert -- when --, therefor.

In column 5, line 12, delete "then," and insert -- then --, therefor.

In column 5, line 15, delete "comprised," and insert -- comprised --, therefor.

Signed and Sealed this
Eighth Day of February, 2011

David J. Kappos
*Director of the United States Patent and Trademark Office*

CERTIFICATE OF CORRECTION (continued)
U.S. Pat. No. 7,838,971 B2

In column 5, line 21, delete "layer's" and insert -- layers --, therefor.

In column 5, line 30, delete "also," and insert -- also --, therefor.

In column 5, line 30, delete "base:" and insert -- base --, therefor.

In column 5, line 39, delete "SOT" and insert -- SOI --, therefor.

In column 5, line 46, delete "Mote" and insert -- Note --, therefor.

In column 5, line 50, delete "uppermost," and insert -- uppermost --, therefor.

In column 5, line 57, delete "ground," and insert -- ground --, therefor.

In column 5, line 61, delete "formed," and insert -- formed --, therefor.

In column 6, line 4, delete "reference," and insert -- reference --, therefor.

In column 6, line 5, delete "foe" and insert -- be --, therefor.

In column 6, line 9, delete "appreciate," and insert -- appreciate --, therefor.

In column 6, line 12, delete "(thin-array" and insert -- (thin array --, therefor.

In column 6, line 21, delete "bonded," and insert -- bonded --, therefor.